(12) United States Patent
Shimazaki et al.

(10) Patent No.: US 9,397,088 B2
(45) Date of Patent: Jul. 19, 2016

(54) SEMICONDUCTOR DEVICE

(71) Applicant: SEIKO INSTRUMENTS INC., Chiba-shi, Chiba (JP)

(72) Inventors: Koichi Shimazaki, Chiba (JP); Yoshitsugu Hirose, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/761,670

(22) PCT Filed: Dec. 20, 2013

(86) PCT No.: PCT/JP2013/084288
§ 371 (c)(1),
(2) Date: Jul. 17, 2015

(87) PCT Pub. No.: WO2014/112293
PCT Pub. Date: Jul. 24, 2014

(65) Prior Publication Data
US 2015/0364464 A1 Dec. 17, 2015

(30) Foreign Application Priority Data
Jan. 18, 2013 (JP) ................................ 2013-007153

(51) Int. Cl.
*H01L 27/088* (2006.01)
*H01L 27/02* (2006.01)
*H01L 29/417* (2006.01)
*H01L 29/78* (2006.01)

(52) U.S. Cl.
CPC ........ *H01L 27/0266* (2013.01); *H01L 27/0207* (2013.01); *H01L 27/0277* (2013.01); *H01L 27/0292* (2013.01); *H01L 29/41758* (2013.01); *H01L 29/78* (2013.01)

(58) Field of Classification Search
CPC .............. H01L 27/0266; H01L 23/535; H01L 27/0277; H01L 29/41758; H01L 27/0207; H01L 29/78; H01L 27/0292
See application file for complete search history.

(56) References Cited

U.S. PATENT DOCUMENTS 6,310,379 B1 * 10/2001 Andresen ............ H01L 27/0277
257/355
2002/0153533 A1 * 10/2002 Okushima ........... H01L 27/0277
257/173

(Continued)

OTHER PUBLICATIONS

International Search Report mailed Mar. 18, 2014 issued in International Appln. No. PCT/JP2013/084288.
Abstract, Publication No. 2008-193019, Publication Date Aug. 21, 2008.

*Primary Examiner* — Victor A Mandala
(74) *Attorney, Agent, or Firm* — Adams & Wilks

(57) ABSTRACT

In order to provide a semiconductor device having high ESD tolerance, a plurality of source wirings (22) are formed of metal films having the same shape and electrically connect a plurality of sources (12) to a ground voltage wiring (22a), respectively, a plurality of drain wirings (23) are formed of metal films having the same shape and electrically connect a plurality of drains (12) to an input voltage wiring (23a), respectively, and a plurality of gate wirings (21) are formed of metal films having the same shape and electrically connect a plurality of gates (11) to the ground voltage wiring (22a), respectively. Further, a back gate wiring (24) is formed of a metal film and electrically connects a back gate (14) to the ground voltage wiring (22a), and the back gate wiring (24) is separated from the source wiring (22) formed on the source (12).

2 Claims, 2 Drawing Sheets

(56) References Cited

U.S. PATENT DOCUMENTS

| | | | | |
|---|---|---|---|---|
| 2008/0002079 A1* | 1/2008 | Kimura | ................ | G02B 6/0051 349/42 |
| 2009/0278207 A1* | 11/2009 | Greenberg | .......... | H01L 23/4824 257/386 |
| 2012/0235210 A1* | 9/2012 | Takemae | ................ | H01L 29/402 257/194 |
| 2012/0326235 A1* | 12/2012 | Otsuru | ................ | H01L 27/0277 257/355 |
| 2013/0127508 A1* | 5/2013 | Chen | ........................ | H03K 5/14 327/276 |

* cited by examiner

SEMICONDUCTOR DEVICE

TECHNICAL FIELD

The present invention relates to a semiconductor device including an NMOS transistor for an electrostatic discharge (ESD) protection circuit.

BACKGROUND ART

First, a related-art semiconductor device is described. FIG. 2 is a plan view of the related-art semiconductor device.

In general, an NMOS transistor is used for an ESD protection circuit for protecting an internal circuit from ESD. The pattern of the NMOS transistor is laid out as illustrated in FIG. 2, for example.

The NMOS transistor includes a plurality of sources 5 and a plurality of drains 4 that are alternately formed, a plurality of even-numbered channels formed between the sources 5 and the drains 4, a plurality of gates 3 formed above the plurality of channels, back gates 1a formed adjacent to outermost sources 5 among the plurality of sources 5, a back gate 1b buried in the other sources 5, and a back gate 1c formed so as to surround the NMOS transistor (see, for example, Patent Literature 1).

CITATION LIST

Patent Literature

[PTL 1] JP 2008-193019 A (FIG. 3)

SUMMARY OF INVENTION

Technical Problem

In the technology disclosed in Patent Literature 1, it is conceivable that respective wirings from the outermost sources 5 among the plurality of sources 5 to the back gate 1a and the back gate 1c are laid out in a single pattern. Then, the area of the wirings for those sources is large, and the value of wiring parasitic resistance is small. When a surge current due to ESD flows through the NMOS transistor for an ESD protection circuit, the surge current is liable to concentrate on the above-mentioned source 1 having a small value of wiring parasitic resistance and therefore concentrate on a source having a large wiring area, with the result that breakdown due to local heat generation is liable to occur. In other words, ESD tolerance of the semiconductor device is liable to be reduced.

The present invention has been made in view of the above-mentioned problem, and provides a semiconductor device having high ESD tolerance.

Solution to Problem

In order to solve the above-mentioned problem, according to one embodiment of the present invention, there is provided a semiconductor device, including: an NMOS transistor for an ESD protection circuit, the NMOS transistor including: a plurality of sources and a plurality of drains that are alternatively formed; a plurality of even-numbered channels formed between the sources and the drains; a plurality of gates formed above the plurality of channels; and a back gate formed close to outermost sources among the plurality of sources; a ground voltage wiring electrically connected to a ground voltage pad used for external connection; and an input voltage wiring electrically connected to an input voltage pad used for external connection, in which: a plurality of source wirings are formed of metal films having the same shape, and electrically connect the plurality of sources to the ground voltage wiring, respectively; a plurality of drain wirings are formed of metal films having the same shape, and electrically connect the plurality of drains to the input voltage wiring, respectively; a plurality of gate wirings are formed of metal films, and electrically connect the plurality of gates to the ground voltage wiring, respectively; and a back gate wiring is formed of a metal film, is separated from the source wirings formed on the sources, and electrically connects the back gate to the ground voltage wiring.

Advantageous Effects of Invention

According to the one embodiment of the present invention, all the source wirings are laid out in the same pattern. Then, a surge current in the NMOS transistor is likely to flow uniformly among the source wirings. In other words, the surge current is less likely to concentrate. Consequently, breakdown due to local heat generation is less likely to occur, resulting in high ESD tolerance.

DESCRIPTION OF EMBODIMENT

Now, an embodiment of the present invention is described with reference to the drawings.

Figure 1:
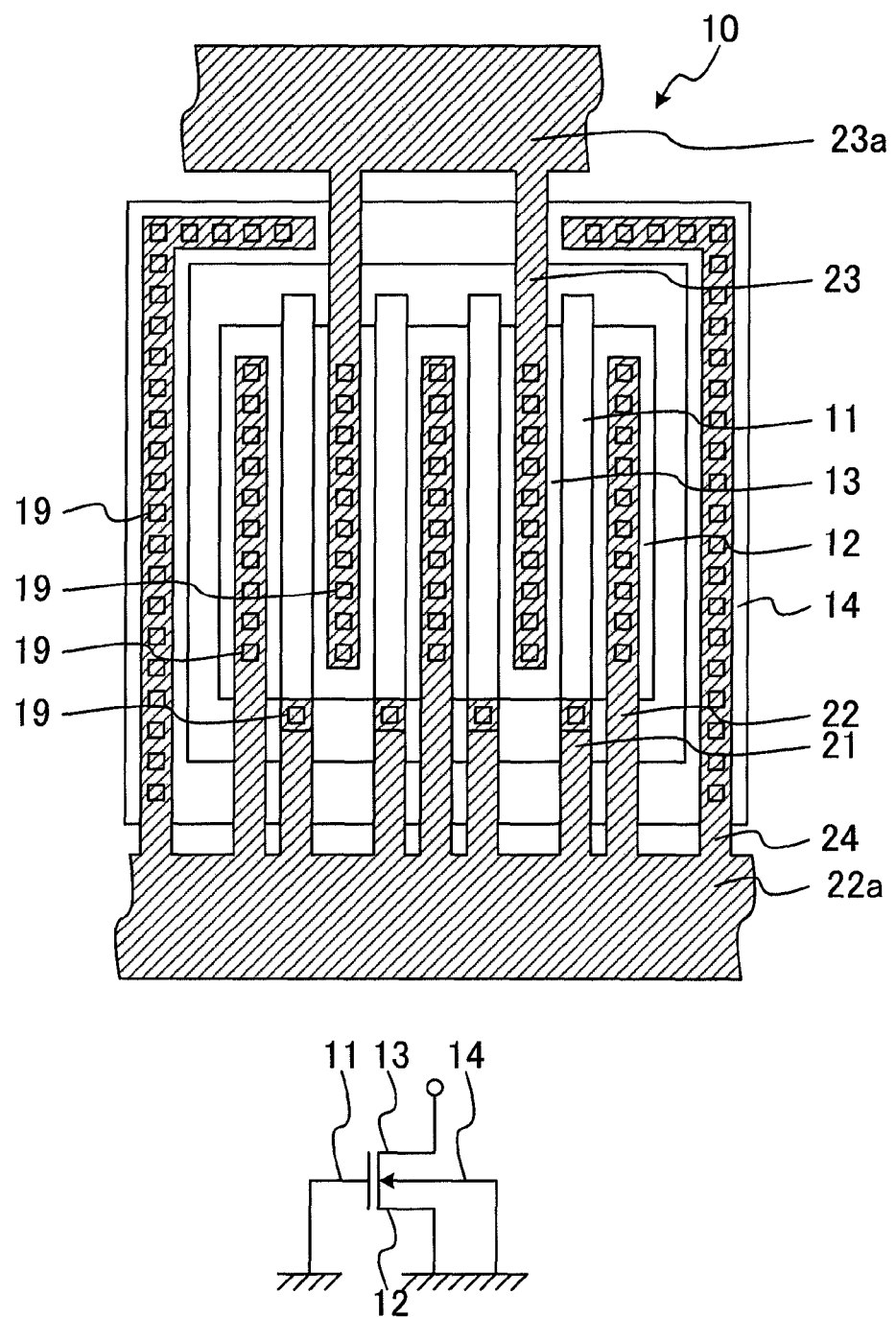
FIG. 1 is a plan view illustrating a semiconductor device.
Figure 2:
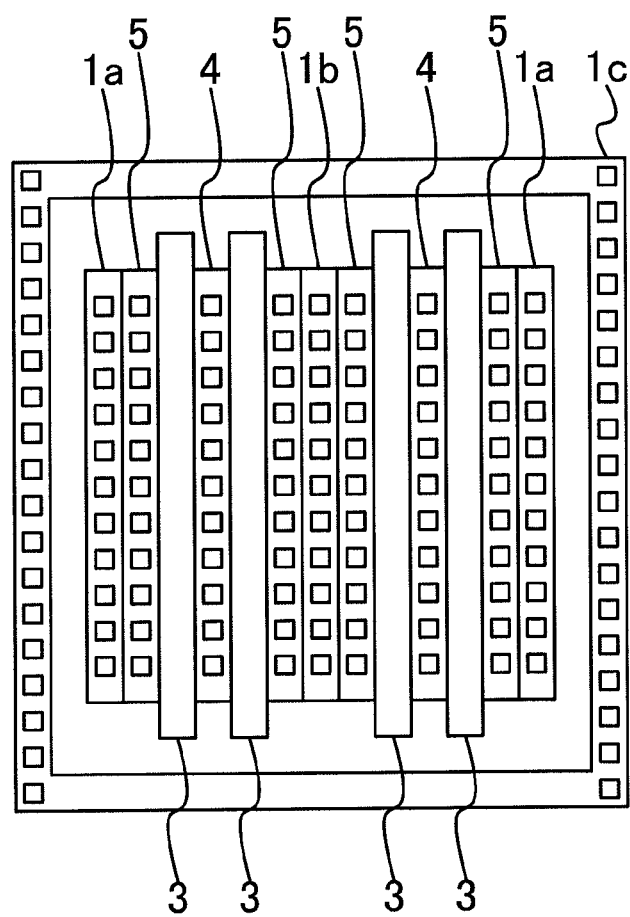
FIG. 2 is a plan view illustrating a related-art semiconductor device.

First, a configuration of a semiconductor device is described. FIG. 1 is a plan view illustrating the semiconductor device.

The semiconductor device includes an NMOS transistor 10 for an ESD protection circuit, a ground voltage wiring 22a, and an input voltage wiring 23a.

The NMOS transistor 10 includes a plurality of sources 12 and a plurality of drains 13 that are alternately formed, a plurality of even-numbered channels formed between the sources 12 and the drains 13, a plurality of gates 11 formed above the plurality of channels, and a back gate 14 formed close to an outermost source 12 among the plurality of sources 12. In this case, a diffusion region formed at an outermost end in a channel length direction of the NMOS transistor 10 is the source 12.

The ground voltage wiring 22a is electrically connected to a ground voltage pad used for external connection. The input voltage wiring 23a is electrically connected to an input voltage pad used for external connection. A plurality of source wirings 22 are formed of metal films having the same shape, and electrically connect the plurality of sources 12 to the ground voltage wiring 22a via contacts 19, respectively. A plurality of drain wirings 23 are formed of metal films having the same shape, and electrically connect the plurality of drains 12 to the input voltage wiring 23a via contacts 19, respectively. A plurality of gate wirings 21 are formed of metal films having the same shape, and electrically connect the plurality of gates 11 to the ground voltage wiring 22a via contacts 19, respectively. A back gate wiring 24 is formed of a metal film, and electrically connects the back gate 14 to the ground voltage wiring 22a via contacts 19. Further, the back gate wiring 24 is separated from the source wiring 22 formed on the source 12.

In this case, in the NMOS transistor 10, the gates 11 are formed of polysilicon on a semiconductor substrate. The sources 12 and the drains 13 are N-type diffusion regions formed in a surface of the P-type semiconductor substrate. The back gate 14 is a P-type diffusion region formed in the surface of the P-type semiconductor substrate. All the wirings, such as the gate wiring 21, are made of aluminum, copper, or the like on the semiconductor substrate.

Next, a description is given of an operation of the NMOS transistor 10 for an ESD protection circuit for protecting an internal circuit from electrostatic discharge (ESD) at the time when an input voltage to the input voltage pad used for external connection is normal.

A voltage between the source 12 and the gate 11 and between the source 12 and the back gate 14 is the ground voltage, and a voltage of the drain 13 is the input voltage. Accordingly, in the normal state, the NMOS transistor 10 is turned off and does not affect the input voltage of the drain 13.

Next, a description is given of an ESD protective operation of the NMOS transistor 10 at the time when a surge current due to ESD flows through the input voltage pad used for external connection.

The surge current due to ESD flows from the input voltage pad to the ground voltage pad. At this time, the parasitic diode of the NMOS transistor 10 causes the surge current to flow in the reverse direction by breakdown operation. Then, although the input voltage pad is electrically connected to the internal circuit of the semiconductor device, the surge current from the input voltage pad does not flow to the internal circuit. Consequently, the internal circuit is protected from the surge current.

In this case, respective wirings to the outermost sources 12 among the plurality of sources 12 and the back gate 14 are not laid out in a single pattern, but the respective wirings are laid out in two different patterns. In other words, all the source wirings 22 are laid out in the same pattern. Consequently, the surge current in the NMOS transistor 10 is likely to flow uniformly among the source wirings 22, and the concentrate of the surge current is less likely to occur. Consequently, breakdown due to local heat generation is less likely to occur, resulting in high ESD tolerance of the semiconductor device.

Note that, the gates 11 maybe connected to one another via polysilicon.

Further, each gate 11 may be connected to each source wiring 22 instead of being connected to the ground voltage wiring 22a.

Further, in each gate 11, a resistive component may exist between the gate 11 and the ground voltage wiring 22a.

Further, the source 12, the drain 13, and the back gate 14 may be formed in a surface of a P-type well instead of being formed in the P-type semiconductor substrate.

REFERENCE SIGNS LIST

10 NMOS transistor
11 gate
12 source
13 drain
14 back gate
19 contact
21 gate wiring
22 source wiring
22a ground voltage wiring
23 drain wiring
23a input voltage wiring
24 back gate wiring

The invention claimed is:

1. A semiconductor device, comprising:
    an NMOS transistor for an ESD protection circuit, the NMOS transistor comprising:
        a plurality of sources and a plurality of drains that are alternatively formed;
        a plurality of even-numbered channels formed between the plurality of sources and the plurality of drains;
        a plurality of gates formed above the plurality of even-numbered channels; and
        a back gate formed close to a plurality of outermost sources among the plurality of sources;
    a ground voltage wiring electrically connected to a ground voltage pad used for external connection;
    an input voltage wiring electrically connected to an input voltage pad used for external connection;
    a plurality of source wirings formed of metal films having the same shape, and electrically connecting the plurality of sources respectively to the ground voltage wiring;
    a plurality of drain wirings formed of metal films having the same shape, and electrically connecting the plurality of drains respectively to the input voltage wiring;
    a plurality of gate wirings formed of metal films, and electrically connecting the plurality of gates respectively to the ground voltage wiring; and
    a back gate wiring formed of a metal film and is separated from the plurality of source wirings, and electrically connecting the back gate to the ground voltage wiring.

2. A semiconductor device according to claim 1, wherein the plurality of gate wirings are formed of metal films having the same shape.

\* \* \* \* \*